United States Patent
Wang et al.

(10) Patent No.: US 10,734,607 B2
(45) Date of Patent: Aug. 4, 2020

(54) ORGANIC LIGHT EMITTING DIODE DISPLAY PANEL AND METHOD FOR ENCAPSULATING SAME

(71) Applicant: WUHAN CHINA STAR OPTOELECTRONICS SEMICONDUCTOR DISPLAY TECHNOLOGY CO., LTD., Wuhan, Hubei (CN)

(72) Inventors: Kan Wang, Wuhan (CN); Junyuan Wang, Wuhan (CN); Hsianglun Hsu, Wuhan (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/085,666

(22) PCT Filed: Aug. 22, 2018

(86) PCT No.: PCT/CN2018/101814
§ 371 (c)(1),
(2) Date: Sep. 17, 2018

(87) PCT Pub. No.: WO2019/223141
PCT Pub. Date: Nov. 28, 2019

(65) Prior Publication Data
US 2019/0363296 A1    Nov. 28, 2019

(51) Int. Cl.
*H01L 51/52* (2006.01)
*H01L 51/56* (2006.01)

(52) U.S. Cl.
CPC .......... *H01L 51/5256* (2013.01); *H01L 51/56* (2013.01)

(58) Field of Classification Search
CPC ............................ H01L 51/56; H01L 51/5256
See application file for complete search history.

(56) References Cited

U.S. PATENT DOCUMENTS

| | | | |
|---|---|---|---|
| 2010/0181903 A1* | 7/2010 | Kim | H01L 51/5271 313/504 |
| 2012/0208306 A1* | 8/2012 | Haas | H01L 51/0014 438/26 |

(Continued)

FOREIGN PATENT DOCUMENTS

| | | |
|---|---|---|
| CN | 20120116782 A | 10/2012 |
| CN | 105322104 A | 2/2016 |

(Continued)

OTHER PUBLICATIONS

English Machine Translation of CN107104202, Wang Y., published 80/29/2017.*

(Continued)

*Primary Examiner* — Peniel M Gumedzoe
(74) *Attorney, Agent, or Firm* — Mark M. Friedman

(57) ABSTRACT

An organic light emitting diode (OLED) display panel and a encapsulation method of the organic light emitting diode display panel are provided. The encapsulation method includes steps of providing an OLED display panel having an OLED light emitting element layer in a display area thereof and an organic peeling layer in a non-display area thereof; laminating an inorganic film layer prepared in a full-surface coating method and an organic film layer only covering the display area sequentially; and peeling off the organic peeling layer together with the inorganic film layer on the surface of the organic peeling layer, so as to form a thin film encapsulation layer.

7 Claims, 4 Drawing Sheets

(56) References Cited

U.S. PATENT DOCUMENTS

| | | | |
|---|---|---|---|
| 2015/0144930 A1* | 5/2015 | Kim | H01L 51/0533 |
| | | | 257/40 |
| 2016/0064672 A1* | 3/2016 | Lee | H01L 51/0021 |
| | | | 257/40 |
| 2017/0194579 A1 | 7/2017 | Wang | |
| 2017/0200917 A1 | 7/2017 | Cui et al. | |

FOREIGN PATENT DOCUMENTS

| | | |
|---|---|---|
| CN | 105449121 A | 3/2016 |
| CN | 105633281 A | 6/2016 |
| CN | 106158740 A | 11/2016 |
| CN | 106328827 A | 1/2017 |
| CN | 106374057 A | 2/2017 |
| CN | 106711184 A | 5/2017 |
| CN | 107104202 A | 8/2017 |

OTHER PUBLICATIONS

English Machine Translation of KR20120116782, Lim et al., published Oct. 23, 2012.*

* cited by examiner

Appendix

ORGANIC LIGHT EMITTING DIODE DISPLAY PANEL AND METHOD FOR ENCAPSULATING SAME

FIELD OF INVENTION

This disclosure relates to display technology, and more particularly to an organic light emitting diode display panel and a encapsulation method of the organic light emitting diode display panel. encapsulation

BACKGROUND OF INVENTION

A flexible organic light emitting diode (OLED) display is suitable for application in wearable display devices due to low energy consumption, bendability, and other characteristics. The flexible OLED display is a popular technology for display industry. Generally, a thin film encapsulation design of the flexible OLED display panel generally uses an organic/inorganic film layer overlap structure to achieve water and oxygen blocking, foreign matter blocking, and stress release.

At present, one method of preparing the inorganic film layer in a thin film encapsulation process is generally performed by plasma enhanced chemical vapor deposition (PECVD), atomic layer deposition (ALD) or pulsed laser deposition (PLD), and other deposition methods. These methods use a mask during the thin film encapsulation process. In the PECVD method, if a surface of the mask is contaminated by foreign matter and is not cleaned in time, arcing may occur under a reaction of positive and negative electric fields, thereby causing damage to the mask. Simultaneously, the surface of the mask may be damaged due to plasma erosion. The mask needs to be replaced on time and that causes high maintenance costs. For the methods such as ALD and PLD, since a self-cleaning function is not provided, the surface of the mask will gradually accumulate depositions of film layers with over time, and the deposited film layer is difficult to clean, thereby causing overall higher costs.

Thus, it is necessary to provide an organic light emitting diode display panel and a encapsulation method of the organic light emitting diode display panel to solve problems of the prior art.

SUMMARY OF INVENTION

The object of this disclosure is to provide an organic light emitting diode display panel and a encapsulation method of the organic light emitting diode display panel, which is not necessary to use a mask in a thin film encapsulation process, so that a PECVD, ALD, PLD and other methods can adopt a full-surface coating method, thereby reducing production and maintenance costs.

In order to solve the above-mentioned drawbacks, the disclosure provides an organic light emitting diode display panel and a encapsulation method of the organic light emitting diode display panel. The encapsulation method comprises steps of:

a step S1 of providing the OLED display panel to be packaged, wherein an OLED light emitting element layer is formed in a display area of the OLED display panel, and an organic peeling layer is formed in a predetermined position of a non-display area of the OLED display panel around the display area;

a step S2 of performing a encapsulation process of the OLED display panel, to form inorganic film layers and organic film layers alternately stacked on the OLED display panel so as to form a thin film package stack, wherein the inorganic film layers completely cover the display area and the non-display area, and the organic film layers only completely cover the display area;

a step S3 of peeling off the organic peeling layer together with a corresponding portion of the inorganic film layers covering the organic peeling layer so as to form a thin film encapsulation layer encapsulating the OLED light emitting element layer.

According to a preferred embodiment of the disclosure, a projection of the organic film layer projected on the OLED display panel overlaps a projection of the OLED light emitting element layer projected on the OLED display panel, but does not overlap a projection of the organic peeling layer projected on the OLED display panel.

According to a preferred embodiment of the disclosure, the organic peeling layer is made of a parylene polymer.

According to a preferred embodiment of the disclosure, before the step S1, the encapsulation method further comprises steps of: a step S10 of providing a substrate, and forming an organic peeling layer by a thermal evaporation method at a predetermined position of a non-display area of the substrate; and a step S11 of forming a OLED light emitting element layer in a display area of the substrate.

According to a preferred embodiment of the disclosure, a method for preparing the organic peeling layer comprises: heating a precursor of the parylene polymer to fully gasify, and continuing to heat in a vacuum environment to pyrolyze the precursor into monomers of the parylene polymer, then importing the monomers of the parylene polymer into a thermal evaporation chamber to perform a thermal evaporation process, and forming the organic peeling layer at the predetermined position on a surface of the substrate using a mask plate.

According to a preferred embodiment of the disclosure, the mask plate comprises a mask frame and at least a first mask portion disposed within the mask frame, the first mask portion corresponds to a corresponding region of the thin film encapsulation layer, at least one first mask portion is connected to the mask frame through a second mask portion, and the second mask portion is interval disposed in a corresponding portion corresponding to the organic peeling layer.

According to a preferred embodiment of the disclosure, in the thermal evaporation process, the thermal evaporation process of the organic peeling layer is performed using two mask plates respectively, and wherein the second mask portion of a first mask plate and the second mask portion of a second mask plate do not overlap.

According to a preferred embodiment of the disclosure, in the thermal evaporation process, the thermal evaporation process is performed two times by a same mask plate, wherein after a first thermal evaporation process is completed, the mask plate is rotated 180° and then a second thermal evaporation process is performed, wherein a position of the second mask portion of the mask plate corresponding to the substrate in the first thermal evaporation process does not overlap with a position of the second mask portion of the mask plate corresponding to the substrate in the second thermal evaporation process.

According to a preferred embodiment of the disclosure, a boundary of the organic peeling layer close to a side of the OLED light emitting element layer corresponds to a predetermined boundary of the thin film encapsulation layer.

The disclosure further provides an organic light emitting diode (OLED) display panel packaged by the encapsulation method.

The disclosure further provides organic light emitting diode (OLED) display panel, which comprises: a substrate including a display area and a non-display area, an OLED light emitting element layer disposed on the substrate corresponding to the display area, an organic peeling layer disposed on the substrate corresponding to the non-display area surrounding the OLED light emitting element layer, wherein a gap is defined between the organic peeling layer and the OLED light emitting element layer, inorganic film layers disposed on the OLED light emitting element layer and the organic peeling layer corresponding to the display area and the non-display area, organic film layers disposed on the inorganic film layer only corresponding to the display area.

The inorganic film layers and the organic film layers are sequentially stacked. The inorganic film layer and the organic film layer are configured to encapsulate an OLED display panel, and after the organic peeling layer is peeled off, a thin film package layer is formed, wherein the inorganic film layers and the organic film layers are alternately laminated.

According to a preferred embodiment of the disclosure, the organic peeling layer extends from an edge of the gap to an edge of the substrate.

According to a preferred embodiment of the disclosure, a peeling of a portion of the organic peeling layer, corresponding to the inorganic film layer, corresponds to a peeling of the inorganic film layer.

Advantageous effects of the disclosure are as follows. This disclosure relates to the organic light emitting diode display panel and the encapsulation method of the organic light emitting diode display panel. An easily peelable organic peeling layer is formed on a predetermined area on a surface of an array substrate by a thermal evaporation method. A Thin film encapsulation is performed directly on the organic peeling layer and an OLED display panel layer through a full-surface coating method without using a mask. Moreover, thin film encapsulation layers disposed on an interval area between celled display panels are removed by a stripping process of peeling the organic peeling layer. Thus, the mask is not necessary to be used during the encapsulation method. The full-surface coating method can be adopted in a PECVD, ALD, PLD and other methods. A process of the encapsulation method is simple and avoids problems such as damage to the mask and difficulty in cleaning, and reduces production and maintenance costs.

DESCRIPTION OF DRAWINGS

In order to more clearly illustrate the embodiments of the disclosure or the technical solutions in the prior art, the following briefly introduces the accompanying drawings used in the embodiments. Obviously, the drawings in the following description merely show some of the embodiments of the disclosure. As regards one of ordinary skill in the art, other drawings can be obtained in accordance with these accompanying drawings without making creative efforts.

DETAILED DESCRIPTION OF PREFERRED EMBODIMENTS

Figure 1:
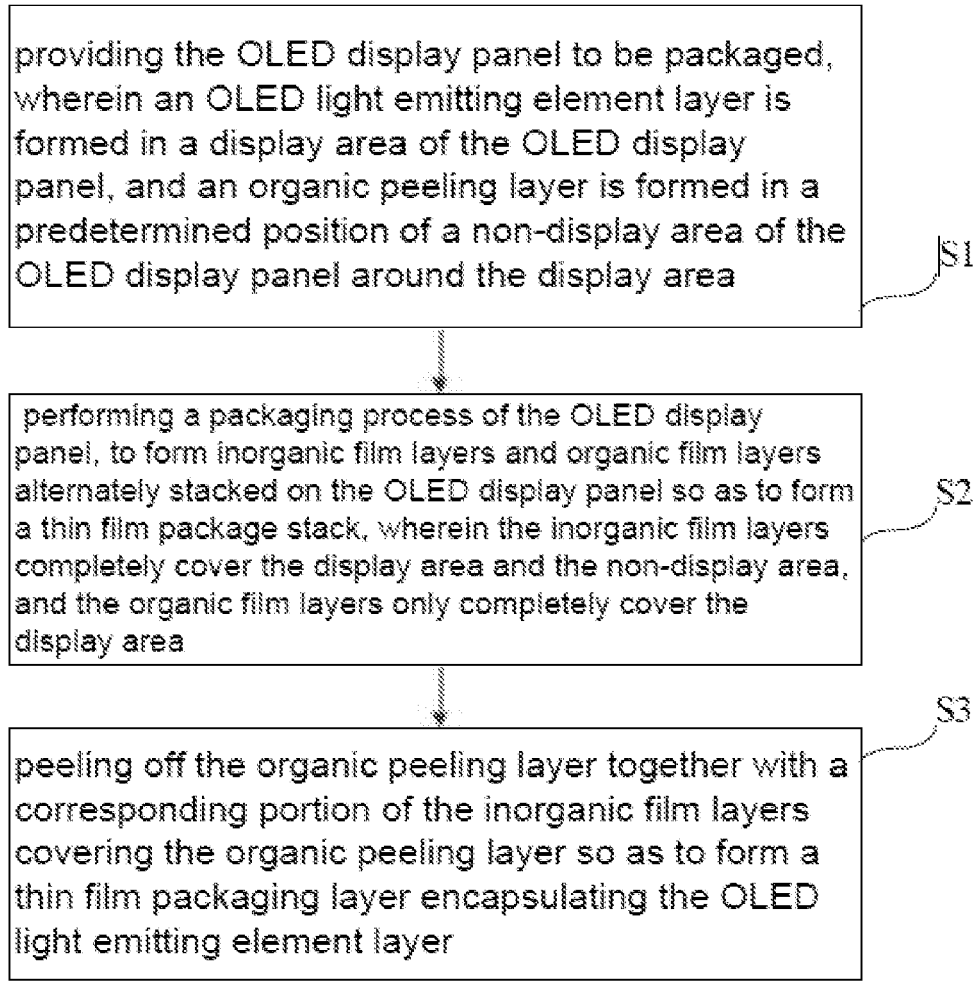
FIG. 1 is a flowchart of a encapsulation method of an organic light emitting diode display panel according to an embodiment of this disclosure.

This description of the exemplary embodiments is intended to be read in connection with the accompanying drawings, which are to be considered part of the entire written description. In the description, terms such as "lower", "upper", "horizontal", "vertical", "above", "below", "up", "down", "top", and "bottom", as well as derivatives thereof, should be construed to refer to the orientation as then described or as shown in the drawing under discussion. These terms are for convenience of description and do not require that the apparatus be constructed or operated in a particular orientation, and do not limit the scope of the disclosure. Referring to the drawings of the disclosure, similar components are labeled with the same number.

A conventional encapsulation method of an OLED display panel requires a mask to perform a coating process of a thin film encapsulation layer. The mask is easily damaged in the coating process and difficult to clean, and a maintenance cost is high. The disclosure is capable of solving this drawback.

Referring to FIG. 1, a flowchart of a encapsulation method of an organic light emitting diode display panel according to an embodiment of this disclosure is shown. The encapsulation method comprises following steps.

In step S1, of providing the OLED display panel to be packaged. An OLED light emitting element layer is formed in a display area of the OLED display panel, and an organic peeling layer is formed in a predetermined position of a non-display area of the OLED display panel around the display area.

In step S2, performing a encapsulation process of the OLED display panel, to form inorganic film layers and organic film layers alternately stacked on the OLED display panel so as to form a thin film package stack. The inorganic film layers completely cover the display area and the non-display area, and the organic film layers only completely cover the display area.

In step S3, peeling off the organic peeling layer together with a corresponding portion of the inorganic film layers covering the organic peeling layer, so as to form a thin film encapsulation layer encapsulating the OLED light emitting element layer.

Specifically, referring to FIGS. 2A-2F, schematic views of flowcharts of a encapsulation method of an organic light emitting diode display panel according to the embodiment of this disclosure are shown.

Figure 2A:
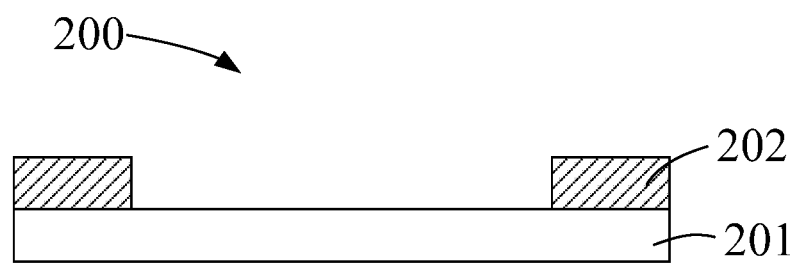
FIGS. 2A-2F are schematic views of flowcharts of a encapsulation method of an organic light emitting diode display panel according to the embodiment of this disclosure.

As shown in FIG. 2A, before the step S1, the encapsulation method further comprises steps of: providing a substrate 201. The substrate 201 comprises a display area and a non-display area. An organic peeling layer 202 is formed by a thermal evaporation method at a predetermined position of a non-display area of the substrate. The organic peeling layer is made of a parylene polymer, which is selected from the group consisting of Parylene C, Parylene N, Parylene AF4, Parylene AF8. The parylene polymer has characteristics of high temperature resistance, ultraviolet resistance, etc., and has no corrosion to the substrate 201. Moreover, the organic peeling layer 202 has no stickiness and is easily peeled off from a surface of the substrate 201, and does not require a laser lift-off process for peeling off the organic peeling layer. The organic peeling layer 202 has a film thickness of 1 μm to 100 μm.

Figure 2B:
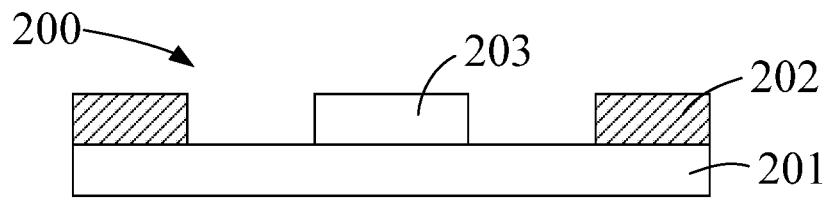

As shown in FIG. 2B, an OLED light emitting element layer 203 is provided in the display area of the substrate 201. The OLED light emitting element layer 203 includes a hole injection layer, a hole transport layer, an organic light emitting layer, an electron transport layer, an electron injection layer, a cathode layer, and the like. The organic peeling layer 202 cannot overlap the OLED light emitting element layer 203, and the organic peeling layer 202 surrounds the OLED light emitting element layer 203 with a gap of a predetermined distance therebetween. A boundary of the organic peeling layer 202 away from a side of the OLED light emitting element layer 203 corresponds to a boundary of the substrate 201. A boundary of the organic peeling layer 202 adjacent to a side of the OLED light emitting element layer 203 corresponds to a predetermined boundary required for a thin film encapsulation process, that is, corresponds to the a predetermined boundary of the thin film encapsulation layer required for a thin film encapsulation process.

Certainly, in different embodiments of this disclosure, the OLED light emitting element layer 203 may also be early prepared on the substrate 201, and then the organic peeling layer 202 may be prepared, and those details are omitted in the interest of brevity.

Figure 2C:
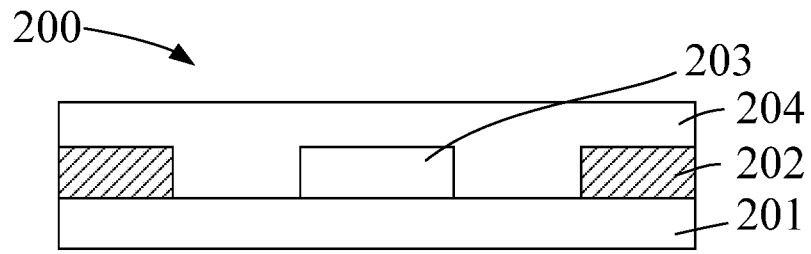

As shown in FIG. 2C, a full-surface first inorganic film layer 204 is formed on the OLED light-emitting element layer 203 and the organic peeling layer 202, the first inorganic film layer 204 completely overlaps the display area and the non-display area. The first inorganic film layer 204 is deposited on an entire surface of the substrate 201 by a process such as PECVD or ALD or PLD. There is no need to utilize a mask plate during this process. Preferably, the first inorganic film layer 204 has a thickness of 0.1 μm to 10 μm. The material of the first inorganic film layer 204 can be, but not limited to, one or more of SiNx, SiOxNy, SiOx, SiCNx, AlOx, TiOx, and the like.

Figure 2D:
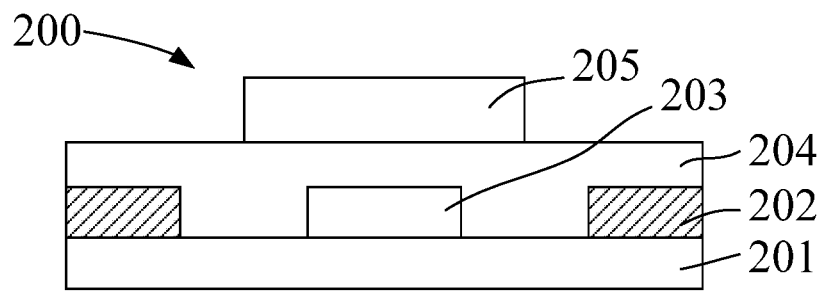

As shown in FIG. 2D, a first organic film layer 205 is prepared on a surface of the first inorganic film layer 204, the first organic film layer 205 completely overlaps the display area. The first organic film layer 205 can be deposited on the surface of the first inorganic film layer 204 by inkjet printing. A projection of the first organic film layer 205 projected on the substrate 201 overlaps a projection of the OLED light emitting element layer 203 projected on the substrate 201, but does not overlap a projection of the organic peeling layer 202 projected on the substrate 201. Preferably, the first organic film layer 205 has a film thickness of 4 μm to 12 μm. The material of the first organic film layer 205 is, but not limited to, one or more of acryl-based (Acryl), hexamethyldisilazane ethers (HMDSO), polyacrylates, polycarbonate, polystyrene and the like.

Figure 2E:
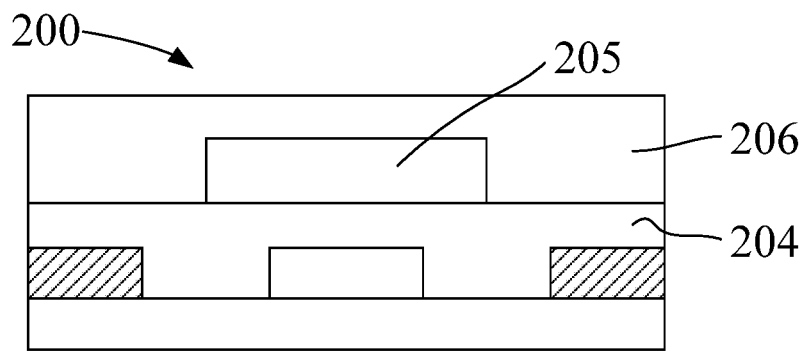

As shown in FIG. 2E, a second inorganic film layer 206 is prepared on a surface of the first organic film layer 205, and the second inorganic film layer 206 is prepared in the same method as the first inorganic film layer 204 and materials are the same. The second inorganic film layer 206 also overlaps an entire surface of the substrate 201. Preferably, the second inorganic film layer 206 has a thickness of 0.1 μm to 10 μm.

It should be noted that the above-described process of preparing the inorganic film layer and the organic film layer can repeated a plurality of times to form a laminated thin film package stack structure on the OLED display panel.

Figure 2F:
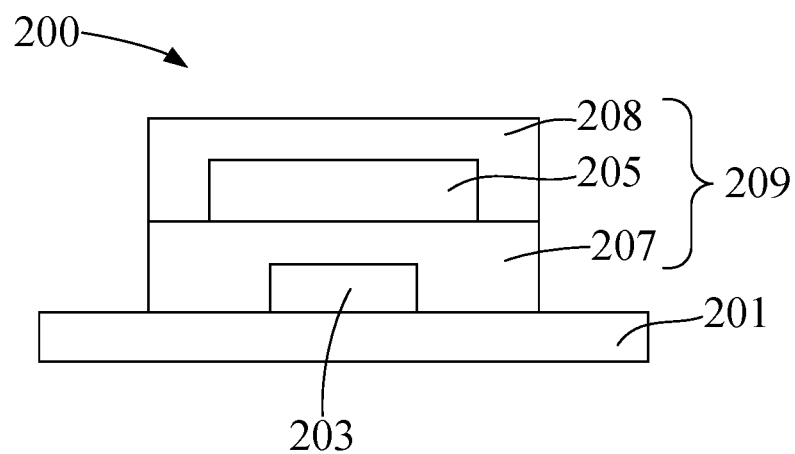

As shown in FIG. 2F, the organic peeling layer 201 on a surface of the substrate 201 can be peeled off by a method such as being done manually or adhesive tape. In the method, the first inorganic film layer and the second inorganic film layer covered on a surface of the organic peeling layer 202 are also peeled off together with the organic peeling layer to form a first inorganic film block 207 and a second inorganic film block 208 in a uniform size. The second inorganic film block 208 overlaps the first organic film layer 205. The first inorganic film block 207, the first organic film layer 205 and the second inorganic film block 208 form a thin film package layer 209 encapsulating the OLED light emitting device layer 203. The encapsulation method of the OLED display panel is completed.

In the encapsulation method of an organic light emitting diode display panel, a method for preparing the organic peeling layer comprises: heating a precursor of the parylene polymer to fully gasify, and continuing to heat in a vacuum environment to pyrolyze the precursor into monomers of the parylene polymer, then importing the monomers of the parylene polymer into a thermal evaporation chamber to perform a thermal evaporation process, and forming the organic peeling layer at the predetermined position on a surface of the substrate using a mask plate.

Figure 3A:
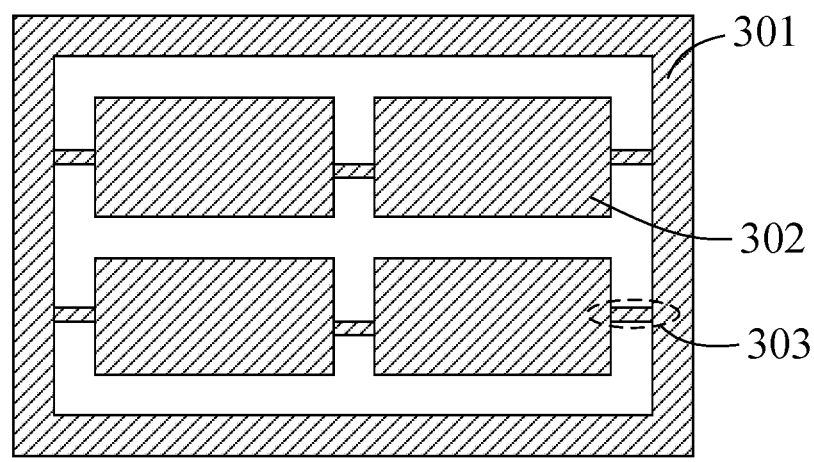
FIGS. 3A-3B are structural schematic views of a mask plate for preparing an organic peeling layer according to a first embodiment of this disclosure.
Figure 3B:
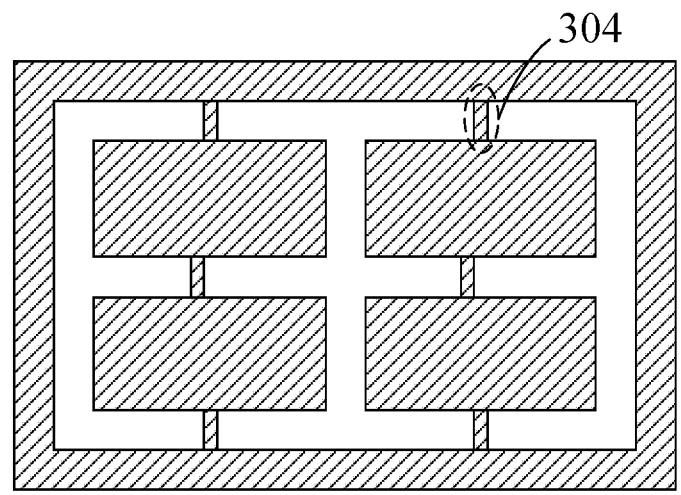

Specifically, referring to FIGS. 3A-3B, structural schematic views of the mask plate for preparing an organic peeling layer according to a first embodiment of this disclosure are shown. The mask plate comprises a mask frame 301 and at least a first mask portion 302 disposed within the mask frame 301. The first mask portion 302 is connected to the mask frame 301 via a second mask portion 303, and the second mask portion 303 is interval disposed in a corresponding organic peeling layer region corresponding to the organic peeling layer. In the embodiment, in the thermal evaporation process, the thermal evaporation process of the organic peeling layer is performed using two mask plates respectively. The structural schematic view of a first mask plate is shown in FIG. 3A. A hollow region is used for evaporating the organic peeling layer, and each of the first mask portions 302 is configured to block a thin film encapsulation layer region set on the corresponding OLED display panel, and the second mask portions 303 are interval disposed along a first direction. The second mask portion 303 is configured to connect the adjacent two first mask portions 302 and to connect the first mask portion 302 to the mask frame 301. the organic peeling layer is performed using two mask plates respectively. The structural schematic view of a second mask plate is shown in FIG. 3B. A difference between the second mask plate and the first mask plate is that second mask portions 304 of the second mask plate are interval disposed along a second direction. After the thermal evaporation process of the first mask plate, the region of the organic peeling layer that is covered by the second mask portion 303 is not vapor-deposited by the organic peeling layer. After the thermal evaporation process of the second mask plate, since the second mask portion 304 of the second mask plate and the second mask portion of the second mask plate 303 do not overlap, the organic peeling layer can be vapor-deposited on the organic peeling layer region.

Figure 4:
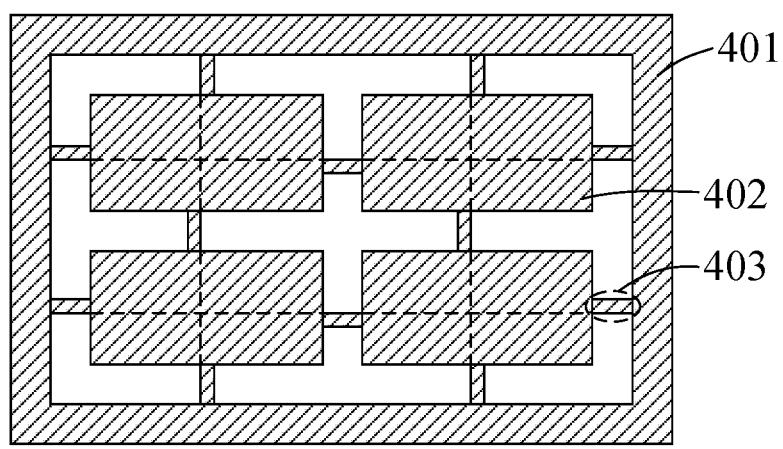
FIG. 4 is a structural schematic view of a mask plate for preparing an organic peeling layer according to a second embodiment of this disclosure.

Referring to FIG. 4, a structural schematic view of a mask plate for preparing an organic peeling layer according to a second embodiment of this disclosure is shown. The mask plate includes a mask frame 401, a first mask portion 402, and a second mask portion 403. The difference between this embodiment and the above embodiment is that: in the thermal evaporation process of the embodiment, the thermal evaporation process is performed two times by a same mask plate, and any one of the second mask portions 403 is disposed completely corresponding to one side of a center line of the first mask portion 402. The second mask portion 403 connected with a center line direction of the first mask portion 402 is located at both sides of the center line. After a first thermal evaporation process is completed, the mask plate is rotated 180° and then a second thermal evaporation process is performed. Since a position of the second mask portion 403 of the mask plate corresponding to the substrate in the first thermal evaporation process does not overlap with a position of the second mask portion 403 of the mask plate corresponding to the substrate in the second thermal evaporation process, the organic peeling layer can be evaporated on the organic peeling layer region.

In this embodiment, there are four first mask portion 402, and the number of the first mask portion 402 can be four or more in other embodiments. Similarly, in other embodiments, the number of the second mask portion 403 connected to one of the first mask portions 402 is not limited to four, and is not limited herein.

The disclosure further provides an organic light emitting diode (OLED) display panel packaged by the encapsulation method.

This disclosure relates to the organic light emitting diode display panel and the encapsulation method of the organic light emitting diode display panel. An easily peelable organic peeling layer is formed on a predetermined area on a surface of an array substrate by a thermal evaporation method. A Thin film encapsulation is performed directly on the organic peeling layer and an OLED display panel layer through a full-surface coating method without using a mask. Moreover, thin film encapsulation layers disposed on an interval area between celled display panels are removed by a stripping process of peeling the organic peeling layer. Thus, the mask is not necessary to be used during the encapsulation method. The full-surface coating method can be adopted in a PECVD, ALD, PLD and other methods. A process of the encapsulation method is simple and avoids problems such as damage to the mask and difficulty in cleaning, and reduces production and maintenance costs.

This disclosure has been described with preferred embodiments thereof, and it is understood that many changes and modifications to the described embodiment can be carried out without departing from the scope and the spirit of the invention that is intended to be limited only by the appended claims.

What is claimed is:

1. An encapsulation method of an organic light emitting diode (OLED) display panel, comprising steps of:
   a step S10 of providing a substrate, and forming an organic peeling layer by a thermal evaporation method at a predetermined position of a non-display area of the substrate; wherein the organic peeling layer is made of a parylene polymer;
   wherein the step for forming the organic peeling layer comprises steps of: heating a precursor of the parylene polymer to fully gasify, and continuing to heat in a vacuum environment to pyrolyze the precursor into monomers of the parylene polymer, then importing the monomers of the parylene polymer into a thermal evaporation chamber to perform a thermal evaporation process, and forming the organic peeling layer at the predetermined position on a surface of the substrate using a mask plate;
   a step S11 of forming an OLED light emitting element layer in a display area of the substrate;
   a step S1 of providing the OLED display panel to be packaged;
   a step S2 of performing a encapsulation process of the OLED display panel, to form inorganic film layers and organic film layers alternately stacked on the OLED display panel so as to form a thin film package stack, wherein the inorganic film layers completely cover the display area and the non-display area, and the organic film layers only completely cover the display area;
   a step S3 of peeling off the organic peeling layer together with a corresponding portion of the inorganic film layers covering the organic peeling layer so as to form a thin film encapsulation layer encapsulating the OLED light emitting element layer.

2. The encapsulation method according to claim 1, wherein a projection of the organic film layer projected on the OLED display panel overlaps a projection of the OLED light emitting element layer projected on the OLED display panel, but does not overlap a projection of the organic peeling layer projected on the OLED display panel.

3. The encapsulation method according to claim 1, wherein the mask plate comprises a mask frame and at least a first mask portion disposed within the mask frame, the first mask portion corresponds to a corresponding region of the thin film encapsulation layer, at least one first mask portion is connected to the mask frame through a second mask portion, and the second mask portion is disposed at intervals in a corresponding portion corresponding to the organic peeling layer.

4. The encapsulation method according to claim 3, wherein in the thermal evaporation process, the thermal evaporation process of the organic peeling layer is performed using two mask plates, and wherein the second mask portion of a first mask plate and the second mask portion of a second mask plate do not overlap.

5. The encapsulation method according to claim 3, wherein in the thermal evaporation process, the thermal evaporation process is performed two times by a same mask plate, wherein after a first thermal evaporation process is completed, the mask plate is rotated 180° and then a second thermal evaporation process is performed, wherein a position of the second mask portion of the mask plate corresponding to the substrate in the first thermal evaporation process does not overlap with a position of the second mask portion of the mask plate corresponding to the substrate in the second thermal evaporation process.

6. The encapsulation method according to claim 1, wherein a boundary of the organic peeling layer close to a side of the OLED light emitting element layer corresponds to a predetermined boundary of the thin film encapsulation layer.

7. An organic light emitting diode (OLED) display panel, packaged by a encapsulation method according to claim 1.

* * * * *

UNITED STATES PATENT AND TRADEMARK OFFICE
CERTIFICATE OF CORRECTION

PATENT NO. : 10,734,607 B2
APPLICATION NO. : 16/085666
DATED : August 4, 2020
INVENTOR(S) : Kan Wang, Junyuan Wang and Hsianglun Hsu Page 1 of 1

It is certified that error appears in the above-identified patent and that said Letters Patent is hereby corrected as shown below:

On the Title Page

Column 1 (30) Foreign Application Priority Data please insert the following:
--May 23, 2018 (CN) 201810499766.7--

Signed and Sealed this
Twenty-ninth Day of December, 2020

Andrei Iancu
*Director of the United States Patent and Trademark Office*